United States Patent [19]

Gokita

[11] 4,443,712
[45] Apr. 17, 1984

[54] SWITCH DEVICE FOR CONNECTING AC POWER SOURCE TO LOAD

[75] Inventor: Masami Gokita, Tokyo, Japan

[73] Assignee: Tokyo Shibaura Denki Kabushiki Kaisha, Kawasaki, Japan

[21] Appl. No.: 378,735

[22] Filed: May 17, 1982

[30] Foreign Application Priority Data

May 20, 1981 [JP] Japan .................................. 56-74851

[51] Int. Cl.³ .......................................... H03K 17/60
[52] U.S. Cl. .............................. 307/140; 307/252 B; 323/325
[58] Field of Search ........... 307/127, 130, 140, 252 B; 361/3, 6; 323/324, 325

[56] References Cited

U.S. PATENT DOCUMENTS 3,743,860 6/1973 Rossell ........................... 307/252 B
4,041,331 7/1977 Westerman et al. ............ 307/252 B
4,119,905 10/1978 Head ..................................... 323/325
4,328,482 5/1982 Belcher et al. ...................... 307/140

FOREIGN PATENT DOCUMENTS 1602988 11/1981 United Kingdom .

Primary Examiner—E. A. Goldberg
Assistant Examiner—Todd E. DeBoer
Attorney, Agent, or Firm—Cushman, Darby & Cushman

[57] ABSTRACT

In a switch device for connecting an AC power source to a load, a phase detector circuit detects the phase of a peak-volt point of the AC voltage. In response to the phase detector circuit, a trigger circuit triggers a semiconductor switching element into conduction at the peak volt point of the AC voltage to supply the AC voltage to the load. The surge current is significantly reduced even if the load is an inductive load.

8 Claims, 8 Drawing Figures

SWITCH DEVICE FOR CONNECTING AC POWER SOURCE TO LOAD

BACKGROUND OF THE INVENTION

The present invention relates to a switch device for controlling supply of a power source voltage to a load.

Mechanical switches or semiconductor switches such as thyristors and triacs are used as means for opening and closing an electric circuit including a power source and a load. If the load is inductive in such an electric circuit, then a surge current which is more than ten times a steady-state current will flow upon closure of the circuit. When such a surge current flows, a circuit breaker interposed between the power source and the load will operate. This means that the circuit breaker must be reset every time the electric circuit is closed.

A zero-volt switch for power control is known. A zero-volt switch of this type has a phase detector for detecting a zero volt point of an AC voltage, and a trigger circuit for turning on a semiconductor switch at a timing that the AC voltage crosses the zero-volt point. Even if the zero-volt switch of this type is used for power control for an inductive load with a core, the surge current cannot be suppressed due to the inductance of the load.

SUMMARY OF THE INVENTION

It is, therefore, an object of the present invention to provide a switch device comprising a semiconductor switching element interposed between an AC power source and a load such as an inductive load, a phase detector for detecting a predetermined phase of an AC voltage, and a trigger circuit for turning on the semiconductor switching element at the predetermined phase of the AC voltage in response to the phase detector so as to apply the AC voltage to the load, and arranged such that the surge current to flow through the load upon turning on the semiconductor switching element may be significantly reduced.

This object of the present invention can be achieved by arranging the phase detector to detect the phase of a peak-volt point of the AC voltage.

DETAILED DESCRIPTION OF THE PREFERRED EMBODIMENT

Figure 1:
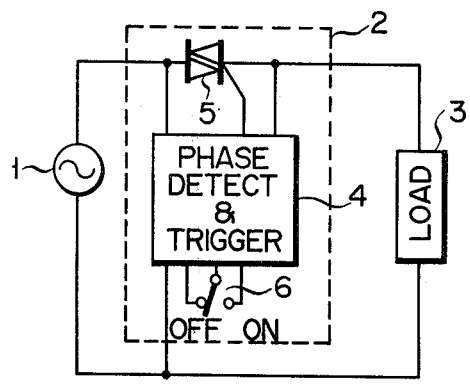
FIG. 1 is a block diagram of a switch device according to an embodiment of the present invention.

Referring now to FIG. 1, there is shown an embodiment of the present invention which comprises an AC power source 4, a switch device 2 embodying the present invention, and a load 3.

The load 3 is an inductive load such as a transformer or a motor, which has a core with a coil wound therearound. The switch device 2 includes a phase detector and trigger circuit 4 for detecting the phase of an AC voltage supplied by AC power source 1 to trigger the switching means at a proper timing, a triac 5 serving as a switching means for opening and closing the electric circuit, and a control switch 6 for controlling the supply of power to the load 3. Control switch 6 is of a single-pole double-throw type and is in OFF state to open the electric circuit in the figure.

When control switch 6 is switched from OFF state to ON state, phase detector and trigger circuit 4 starts detection of the phase of the AC voltage. Upon detection of a peak-volt point of the AC voltage, triac 5 turns ON. Then, the electric circuit is closed and the AC power source voltage is supplied to load 3. According to the present invention, the surge current may be suppressed by turning ON triac 5 at or in the vicinity of the peak-volt point of the AC voltage.

The reason for the suppression of the surge current will now be described.

Figure 2:
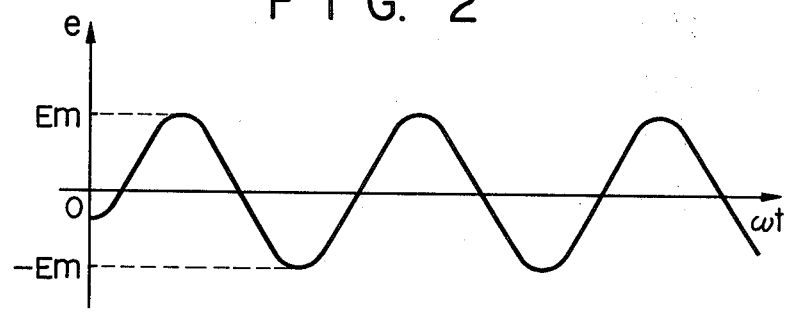
FIGS. 2 to 6 show signal waveforms for explaining the operation of the switch device according to the present invention.

In general, when an AC voltage $e = Em \sin(\omega t + \phi)$ as shown in FIG. 2 is applied to inductive load 3, the next equation holds.

$$n(d\Phi/dt) = Em \sin(\omega t + \phi) \quad (1)$$

where Em is an amplitude of the AC voltage e, t time, $\omega$ an angular frequency, $\Phi$ a magnetic flux, n the number of turns of coil, and $\phi$ a constant phase.

Integrating equation (1) with respect to time t with $\Phi = \Phi r$ (where $\Phi r$ is a residual magnetic flux) taken as an initial condition yields:

$$\Phi = \Phi r + \Phi m \cos\phi + \Phi m \sin(\omega t + \phi - \pi/2) \quad (2)$$

where $\Phi m$ is a constant.

As may be seen from equation (2), the magnetic flux $\Phi$ becomes minimum when $\Phi = \pi/2$ and maximum when $\phi = 0$.

When $\phi = \pi/2$ and $\phi = 0$, the AC voltage e and the magnetic flux $\Phi$ are given as follows:

When $\phi = \pi/2$, $$e = Em \sin(\omega t + \pi/2) \quad (3)$$

$$\Phi = \Phi r + \Phi m \sin\omega t \quad (4)$$

When $\phi = 0$, $$e = Em \sin\omega t \quad (5)$$

$$\Phi = \Phi r + \Phi m \{1 + \sin(\omega t - \pi/2)\} \quad (6)$$

Figure 3:
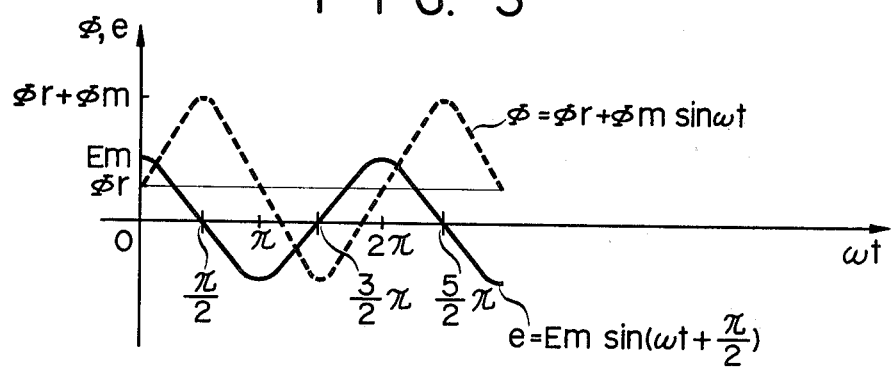
Figure 4:
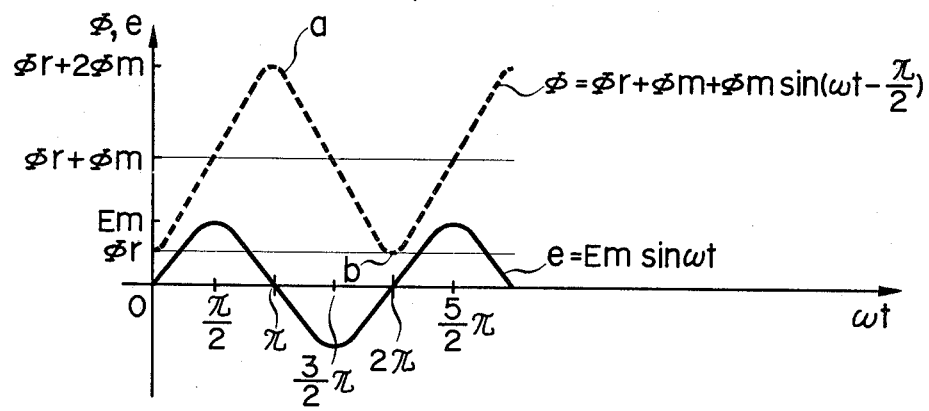

The AC voltage e and the magnetic flux $\Phi$ given by equations (3) and (4) are shown in FIG. 3, while those given by equations (5) and (6) are shown in FIG. 4.

FIG. 3 shows the magnetic flux $\Phi$ which is obtained when load 3 is connected to AC power source 1 at a peak volt point of the AC voltage, while FIG. 4 shows the same obtained when load 3 is connected to AC power source 1 at a zero-volt point of the AC voltage. As may be seen from FIG. 4, if AC power source 1 is connected to load 3 at the zero-volt point of the AC voltage, then the magnetic flux $\Phi$ reaches its maximum value, $\Phi r + 2\Phi m$.

Figure 5:
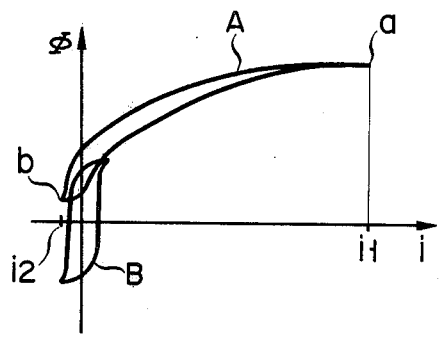
Figure 6:
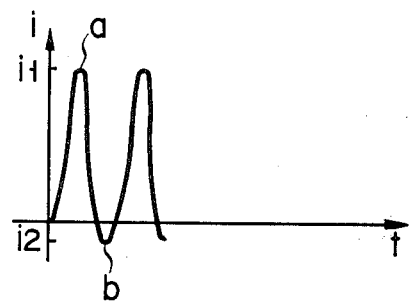

Current i flowing through load 3 and magnetic flux $\Phi$ in the core form a hysteresis loop as shown in FIG. 5. Hysteresis loop A represents characteristics in the transient state, while hysteresis loop B represents characteristics in the steady state. If currents at saturation points a and b of the magnetic flux $\Phi$ of hysteresis loop A ar given by i1 and i2, the surge current i is drawn as shown in FIG. 6. Points a and b shown in FIGS. 5 and 6 correspond to those in FIG. 4. As seen from FIG. 6, the surge current i is maximum at point a and has a magnitude more than 10 times that of a steady state current.

The surge current i occurs due to a transient phenomenon so that the current flowing through the circuit is reduced to the steady state current as time elapses. If the resistance of load 3 is represented by R and the inductance thereof is represented by L, the surge current i decays with time t as a function of $\epsilon^{-R/L \cdot t}$.

Thus, as shown in FIG. 3, the surge current i may be significantly reduced if AC power source 1 is connected to load 3 at a peak-volt point of the AC voltage.

The phase detector and trigger circuit 4 embodying the present invention will now be described in detail with reference to FIG. 7.

A phase detector 4A comprises a step-down transformer 10 having a primary winding 10a connected to AC power source 1, a first secondary winding 10b connected to a DC power source 11 to provide a regulated DC voltage Vcc of 5 V, for exampleand a second secondary winding 10c connected to a full-wave rectifying circuit 12 having bridge-connected diodes D1 to D4. Outputs of full-wave rectifying circuit 12 are coupled to a wave shaping circuit 13 having a resistor 14, a diode 15, Zener diodes 16 and 17, and another resistor 18.

Figure 8:
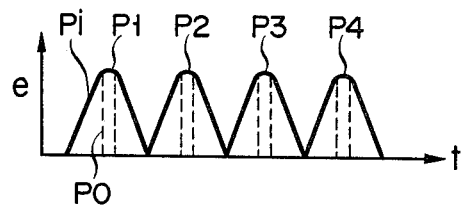
FIG. 8 shows a signal waveform for explaining the detection of peak-volt point phase of the AC voltage.

As shown in FIG. 8, an output voltage Pi of full-wave rectifying circuit 12 is clipped at a voltage level determined by Zener diodes 16 and 17 to provide detected output pulses PO synchronous with peak volt points P1, P2, and so on.

These pulses PO are applied to a clock input CK of a JK flip-flop 19 powered from DC power source 11. An output Q of JK flip-flop 19 is coupled to the base of a driver transistor 20 which is connected in series with a light-emitting diode 21 across DC power source 11. When the J input of JK flip-flop 19 is at a high level and the K input is at a low level, the output Q of JK flip-flop 19 goes from low level to high level to turn ON driver transistor 20 in response to a clock pulse PO applied to its clock input CK. When the driver transistor 20 is turned ON, light-emitting diode 21 lights.

The light-emitting diode 21 is optically coupled to a trigger circuit 4B. The trigger circuit 4B has photothyristors 22 and 23 which are connected in parallel with each other in opposite polarity between the gate of triac 5 and one terminal of AC power source 1 and which are optically coupled to light-emitting diode 21. Photothysistors 22 and 23 are both rendered conductive in response to light emitted by light-emitting diode 21. As a result, triac 5 is triggered to be turned ON.

The control switch 6 having a pole 6a and fixed contacts 6b and 6c is connected to J and K inputs of JK flip-flop 19 for power control. Pole 6a of control switch 6 is connected to receive the output voltage Vcc of DC power source 11. First and second fixed contacts 6b and 6c of control switch 6 are respectively connected to circuit ground by resistors 24 and 25 as well as to J and K inputs of JK flip-flop 19 through resistors 26 and 27, respectively.

Figure 7:
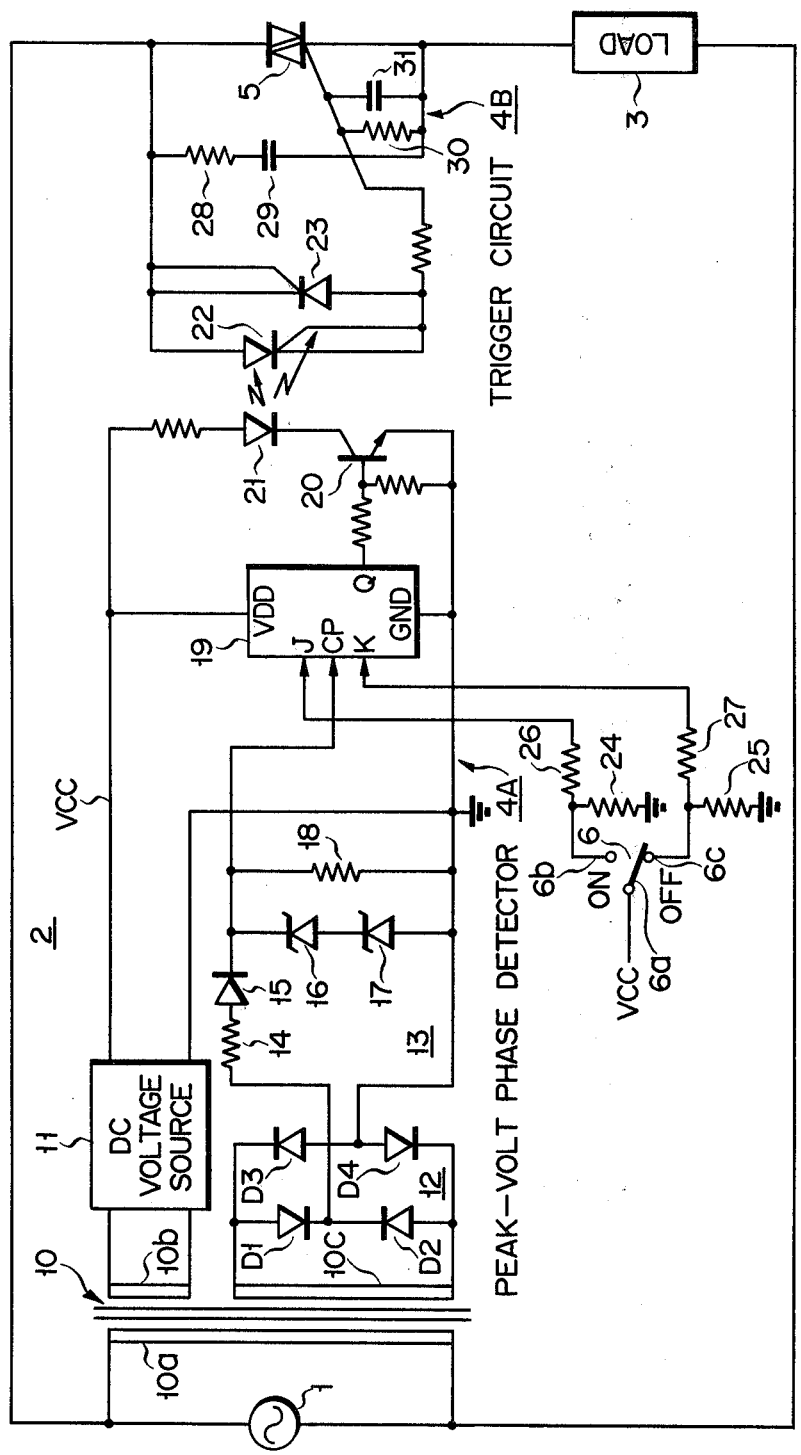
FIG. 7 is a circuit diagram of the switch device according to the present invention.

In FIG. 7, control switch 6 is in OFF position wherein pole 6a is connected to second fixed contact 6c. In this state, J input of JK flip-flop 19 is at ground level, while K input thereof is at Vcc level so that even if clock pulses PO are applied to clock input CP of JK flip-flop 19, the output Q of JK flip-flop 19 stays at ground level. Then, driver transistor 20 is nonconductive and light-emitting diode 20 does not light. Accordingly, photothyristors 22 and 23 are nonconductive and triac 5 is not triggered.

On the other hand, when pole 6a of control switch 6 is switched to contact 6b, the J input of JK flip-flop 19 goes from ground level to Vcc level, while the K input thereof goes from Vcc level to ground level. Under this condition, the output Q of JK flip-flop 19 goes to Vcc level in response to the clock pulse PO applied to clock input CP. Therefore, driver transistor 20 is enabled to cause light-emitting diode 21 to produce light. The photothyristors 22 and 23 are thus rendered conductive to trigger triac 5 into conduction. The AC power source 1 is connected to load 3.

When control switch 6 is switched from ON state to OFF state, J input of JK flip-flop 19 goes to ground level, while K input goes to Vcc level. Under this condition, the output Q of JK flip-flop 19 goes to ground level to render driver transistor 20 nonconductive in response to the next clock pulse PO. As a result, light-emitting diode 21 is disabled to turn off photothyristors 22 and 23. Then, triac 5 turns off.

A series circuit of a resistor 28 and a capacitor 29 and a parallel circuit of a resistor 30 and a capacitor 31 are incorporated for the purpose of preventing an erroneous operation of triac 5.

What is claimed is:

1. A switch device for controlling a bidirectional semiconductor switching element connected between an AC power source and a load, comprising:

means for generating a stream of pulses having a pulse for each positive and negative voltage peak of said AC power source and synchronized therewith;

flip-flop circuit means, having a clock input coupled to said stream of pulses, a control input for controlling whether said flip-flop circuit means is in an "enabled" or a "disable" state, and an output providing pulses synchronized with said stream of pulses at said clock input when in said "enabled" state;

controlled switching means, having a manually operable switch, for providing a control signal to said control input causing said flip-flop circuit means to operate in said "enabled" state in response to said switch being actuated; and trigger circuit means, responsive to said output pulses of said flip-flop circuit means, for controlling said bidirectional switching element.

2. A switch device according to claim 1 wherein said pulse stream generating means comprises:

a full-wave rectifying circuit coupled to said AC power source; and a waveshaping circuit coupled to an output of said full-wave rectifying circuit.

3. A switch device according to claim 1 wherein said flip-flop circuit means comprises a J-K type flip-flop, the J and K inputs thereof constituting said control input.

4. A switch device according to claim 3 wherein said controlled switching means comprises means, responsive to an actuation of said manually operable switch, for providing signals to said J and K inputs for enabling said flip-flop.

5. A switch device according to claim 1 further comprising means for electrically isolating said trigger circuit means from said flip-flop circuit means.

6. A switch device according to claim 5 wherein said isolating means comprises an opto-isolator.

7. A switch device according to claim 1 wherein said trigger circuit means comprises a pair of unidirectional switching devices coupled in parallel and in opposite polarity relation with one another and in series between one side of said AC power source and a trigger input of said bidirectional semiconductor switching element, said pair of switching devices being triggered responsive to output pulses of said flip-flop circuit means.

8. A switch device for closing and opening a bidirectional semiconductor switching element connected between an AC power source and an inductive load comprising:
- a step-down transformer having a primary winding connected across said AC power source and a secondary winding;
- a full-wave rectifying circuit connected across said secondary winding;
- a waveshaping circuit means, connected across said secondary winding, for producing output pulses synchronized to peak-volt points of output voltage of said full-wave rectifying circuit.

* * * * *